(12) United States Patent
Sato

(10) Patent No.: US 6,726,533 B2
(45) Date of Patent: Apr. 27, 2004

(54) METHOD FOR POLISHING LEADS FOR SEMICONDUCTOR PACKAGES

(75) Inventor: Takeyuki Sato, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/994,820

(22) Filed: Nov. 28, 2001

(65) Prior Publication Data
US 2002/0032940 A1 Mar. 21, 2002

Related U.S. Application Data

(62) Division of application No. 09/120,134, filed on Jul. 22, 1998, now Pat. No. 6,336,848.

(30) Foreign Application Priority Data
Sep. 9, 1997 (JP) .......................................... H09-243709

(51) Int. Cl.[7] .............................................. H01L 23/50
(52) U.S. Cl. ............................ 451/29; 29/827; 451/49; 438/115
(58) Field of Search ................................. 438/115, 111, 438/959; 451/29, 49; 29/827

(56) References Cited

U.S. PATENT DOCUMENTS

| 4,826,556 A | * | 5/1989 | Kobayashi .................. 156/345 |
| 4,885,837 A | * | 12/1989 | Eshima et al. .............. 174/52.6 |
| 5,086,018 A | * | 2/1992 | Conru et al. .................... 29/827 |
| 5,643,835 A | * | 7/1997 | Chia et al. ...................... 29/827 |
| 5,794,299 A | | 8/1998 | Gockel et al. ................... 15/77 |
| 5,929,497 A | * | 7/1999 | Chavan et al. .............. 257/417 |
| 5,977,640 A | | 11/1999 | Bertin et al. ................. 257/777 |
| 6,165,819 A | * | 12/2000 | Seki et al. ................... 438/123 |

FOREIGN PATENT DOCUMENTS

| JP | 63-107521 | * | 5/1988 |
| JP | 63-164255 | * | 7/1988 |
| JP | 05-154757 | * | 6/1993 |

* cited by examiner

Primary Examiner—Gregory Mills
Assistant Examiner—Sylvia R MacArthur
(74) Attorney, Agent, or Firm—Venable LLP; Marina V. Schneller

(57) ABSTRACT

In a method for polishing leads of a semiconductor package, a plurality of semiconductor packages is arranged in a certain manner. Then, the leads are automatically polished. The semiconductor packages may be masked to expose at least a part of the leads to be polished.

7 Claims, 7 Drawing Sheets

US 6,726,533 B2

METHOD FOR POLISHING LEADS FOR SEMICONDUCTOR PACKAGES

CROSS REFERENCE TO RELATED APPLICATION

This Application claims the priority of Application No. H09-243709, filed Sep. 9, 1997 in Japan, the subject matter of which is incorporated herein by reference. This Application is a divisional of application Ser. No. 09/120,134 filed Jul. 22, 1998 now U.S. Pat. No. 6,336,848 in the United States of America.

TECHNICAL FIELD OF THE INVENTION

The present invention relates to technology for polishing leads of a semiconductor package, such as an LSI package. And more particularly, the invention relates to a method and an apparatus for polishing leads, which contribute to improve the reliability of a semiconductor package.

BACKGROUND OF THE INVENTION

In semiconductor fabrication processes, a semiconductor package is formed to protect an LSI chip contained therein. To improve the quality of a surface-mounting type of semiconductor package, it is important to make leads to have good contact-reliability.

Conventionally, the leads of an LSI package are manually polished with a brush, or the like. According to the conventional way, however, the polishing process takes a long period of time, and it is difficult to polish the leads without any damages, such as bent and break thereon. Further, it is difficult to polish the leads precisely to provide enough contact-reliability.

OBJECTS OF THE INVENTION

Accordingly, an object of the invention is to provide a method by which leads of a semiconductor package can be polished efficiently and precisely.

Another object of the invention is to provide an apparatus, which polishes leads of a semiconductor package efficiently and precisely.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, in a method for polishing leads of a semiconductor package, a plurality of semiconductor packages are arranged in a certain manner. Then, the leads are automatically polished. The semiconductor packages may be masked to expose at least a part of the leads to be polished.

According to a second aspect of the invention, an apparatus for polishing leads of a semiconductor package, includes a package holder unit, which holds a plurality of semiconductor packages thereon. The apparatus further includes a polishing member that automatically polishes the leads of the semiconductor packages held on the package holder unit. The apparatus may further include a mask that covers the semiconductor packages to expose at least a part of the leads to the polishing member.

DETAILED DISCLOSURE OF THE INVENTION

Figure 1:
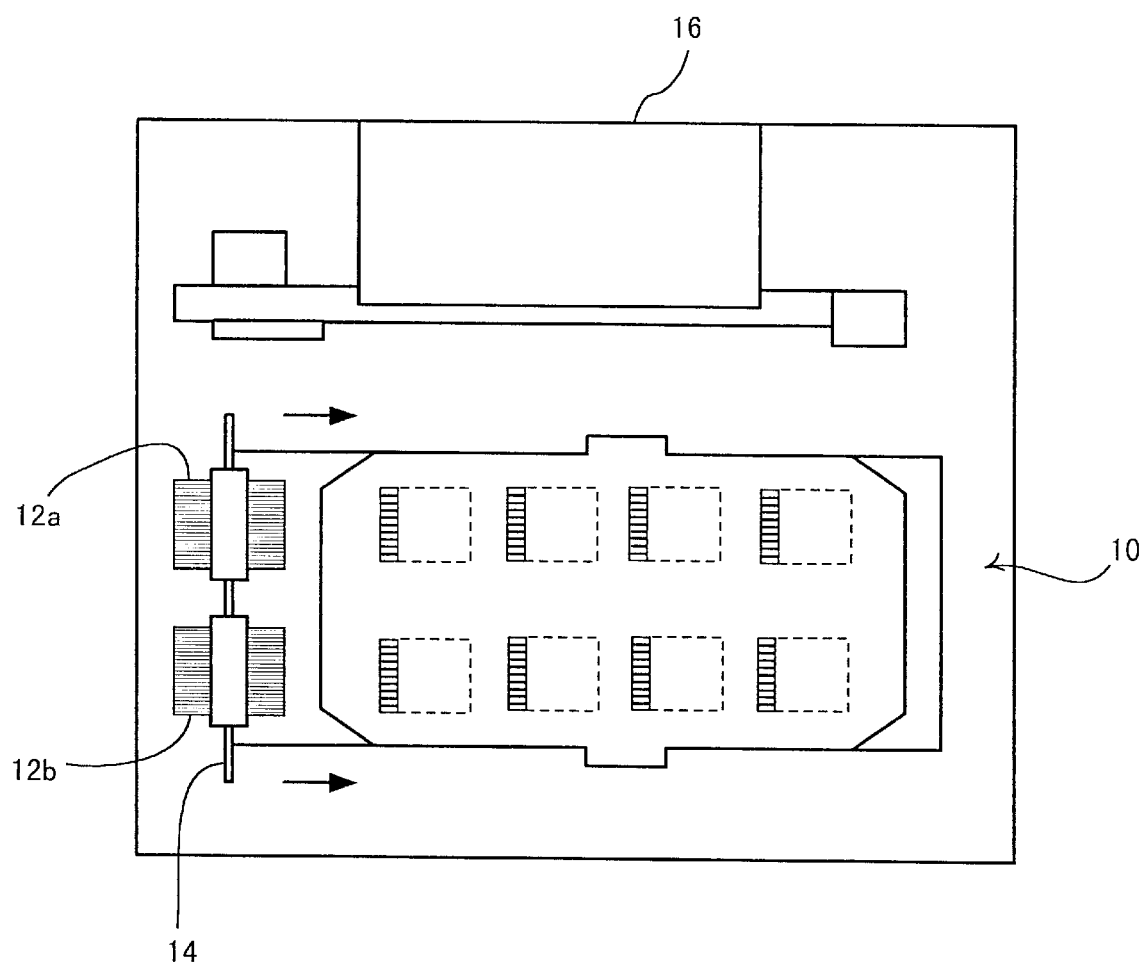
FIG. 1 is a plane view illustrating a polishing apparatus according to an embodiment of the invention.
Figure 2:
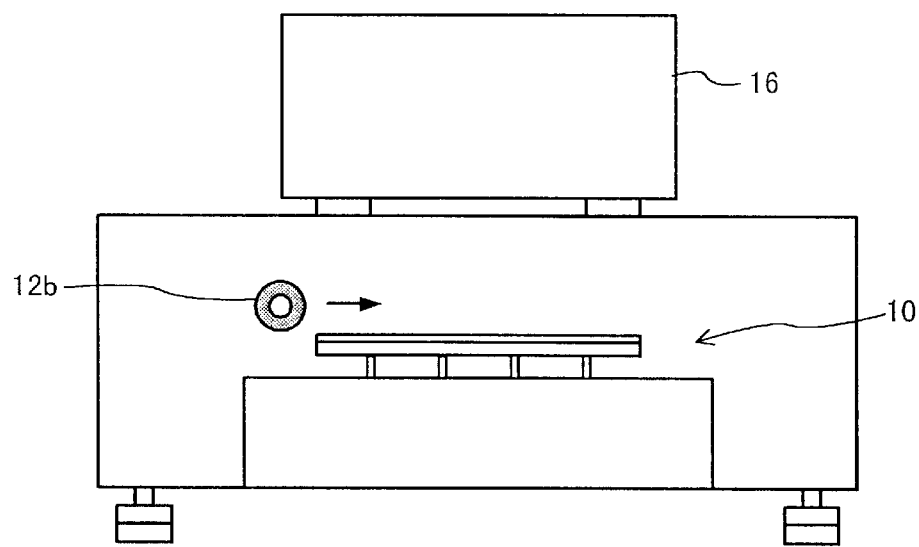
FIG. 2 is a front view illustrating the polishing apparatus according to the embodiment.
Figure 3:
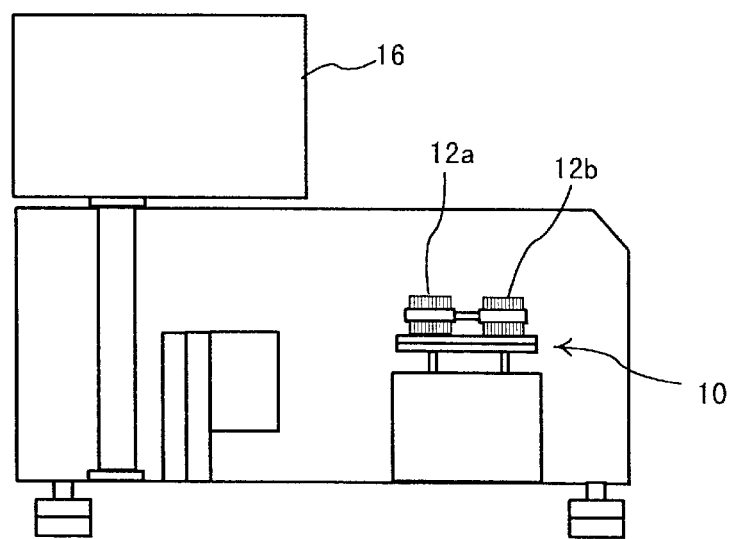
FIG. 3 is a side view illustrating the polishing apparatus according to the embodiment.

FIGS. 1, 2 and 3 show a polishing apparatus, according to an embodiment of the invention, which automatically polishes leads of LSI packages. The polishing apparatus includes a package holder unit 10, a pair of wire brushes 12a and 12b, a shaft 14 and a control unit 16. The package holder unit 10 is designed to hold eight LSI packages on it. The wire brushes 12a and 12b are rotatably provided on the shaft 14, and are designed to move both in vertical and horizontal directions over the package holder unit 10. The wire brushes 12a and 12b may be made of stainless steel or brass. The control unit 16 controls the package holder unit 10 and the wire brushes 12a and 12b so that the leads of LSI packages are well polished.

Figure 4:
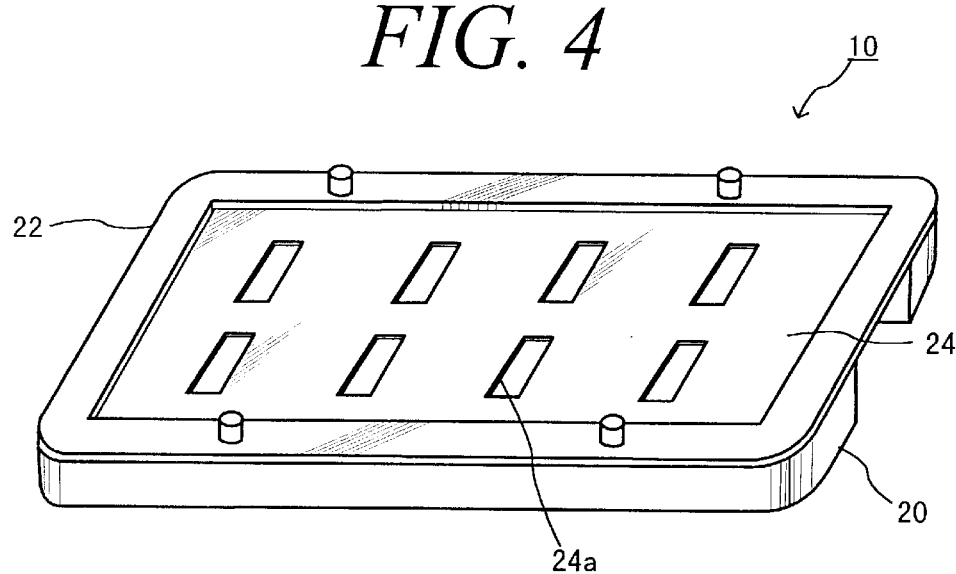
FIG. 4 is a perspective view illustrating a package holder unit used in the polishing apparatus of the embodiment.
Figure 5:
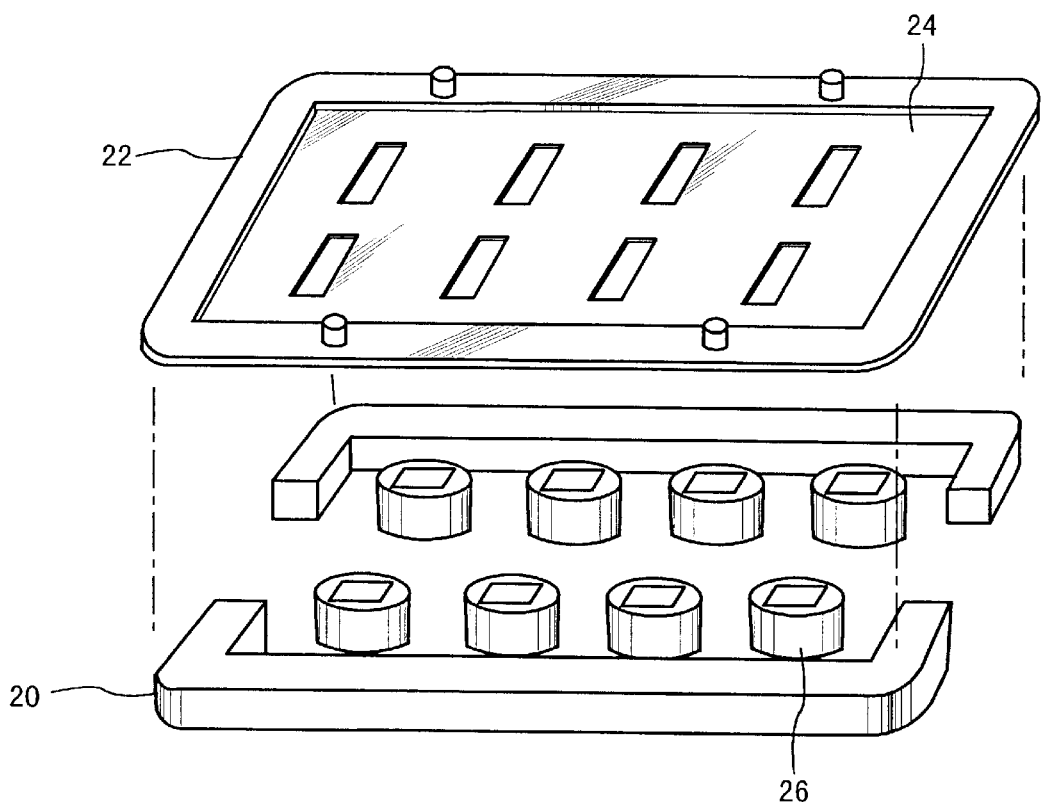
FIG. 5 is a perspective exploded view illustrating the package holder unit shown in FIG. 4.

FIGS. 4 and 5 show the structure of the package holder unit 10. The package holder unit 10 includes a base frame 20, a clamp plate 22, a mask 24 and eight package holders 26. The base frame 20 is composed of two pieces of frame members and is arranged at the bottom of the package holder unit 10. The Clamp plate 22 is shaped square and is designed movable in the vertical direction to clamp LSI packages on the package holders 26. The mask 24 is arranged inside of the clamp plate 22. The mask 24 is provided with eight slits (openings) 24a to expose a part of the leads of each LSI package, held on the package holder 26. In other words, the mask 24 covers the LSI package (32) only to expose one of four lines of lead (32a, 32b, 32c and 32d).

Figure 6:
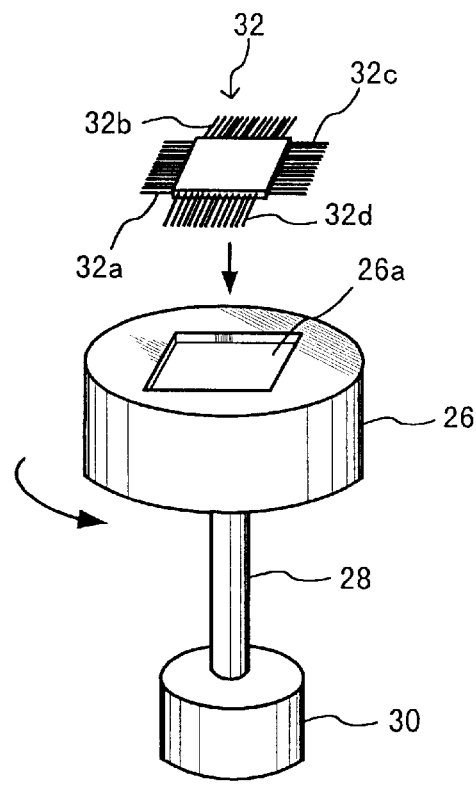
FIG. 6 is a perspective view illustrating a package holder included in the package holder unit shown in FIG. 5.
Figure 7:
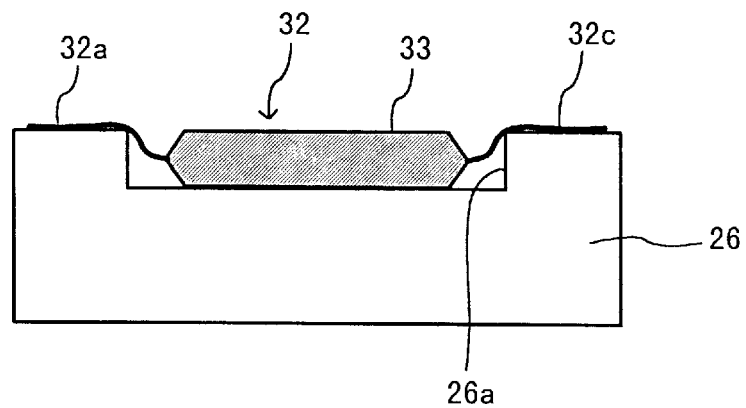
FIG. 7 is a sectional view showing the package holder with a semiconductor package.

FIGS. 6 and 7 show the structure of the package holder 26. The package holder 26 is provided at an upper surface with a cavity 26a into which a package body 33 of an LSI package 32 is contained. The LSI package 32 is held on the package holder 26 so that leads 32a, 32b, 32c and 32d are arranged on the upper surface of the package holder 26. For easy understanding, in this embodiment, the leads 32a, 32b, 32c and 32d are called first, second, third and fourth lines of leads, respectively. The package holder 26 is connected to a motor 30 via a shaft 28 so that the package holder 26 rotates in a horizontal plane. Basically, the motor 30 rotates the package holder 26 for every ninety degrees so that the first to fourth lines of leads 32a, 32b, 32c and 32d are alternately exposed from the slit 24a of the mask 24.

Figure 8:
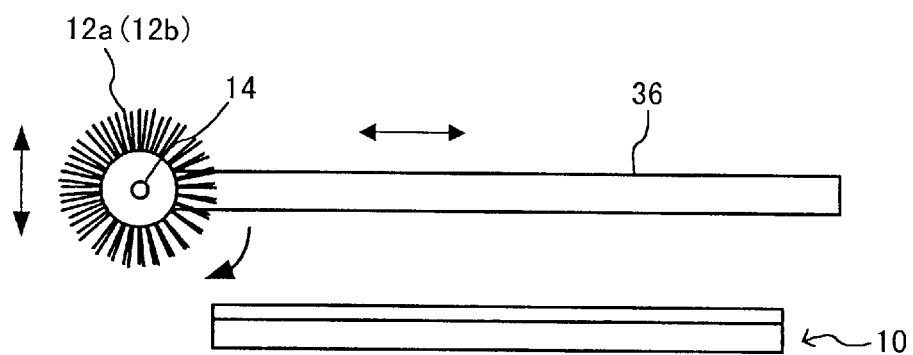
FIG. 8 is a schematic illustration showing the operation of the polishing apparatus of the embodiment.
Figure 9:
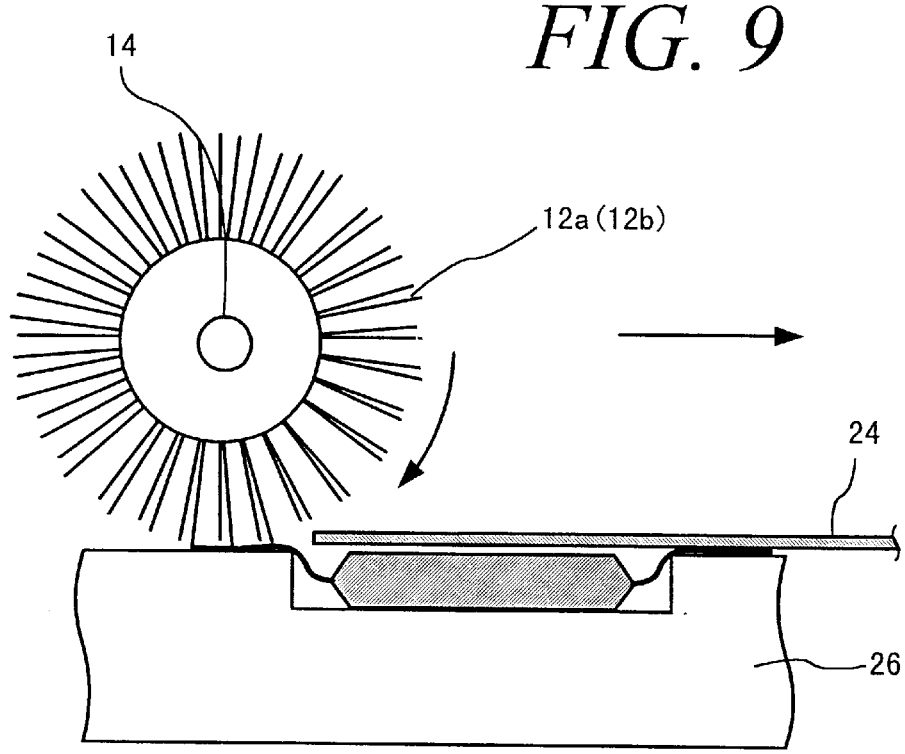
FIG. 9 is a schematic illustration showing the operation of the polishing apparatus of the embodiment.

As shown in FIGS. 8 and 9, the wire brushes 12a and 12b are designed to rotate in the direction shown by an arrow so as to brush the leads 32a (32b, 32c and 32d) in the direction extending from the package body 33 to the ends of the leads 32a. As a result, the leads 32a (32b, 32c and 32d) can be brushed and polished without being bent or broken by the brushing. The wire brushes 12a and 12b are connected to a sliding bar 36 that slides the wire brushes 12a and 12b in the vertical direction.

Figure 10:
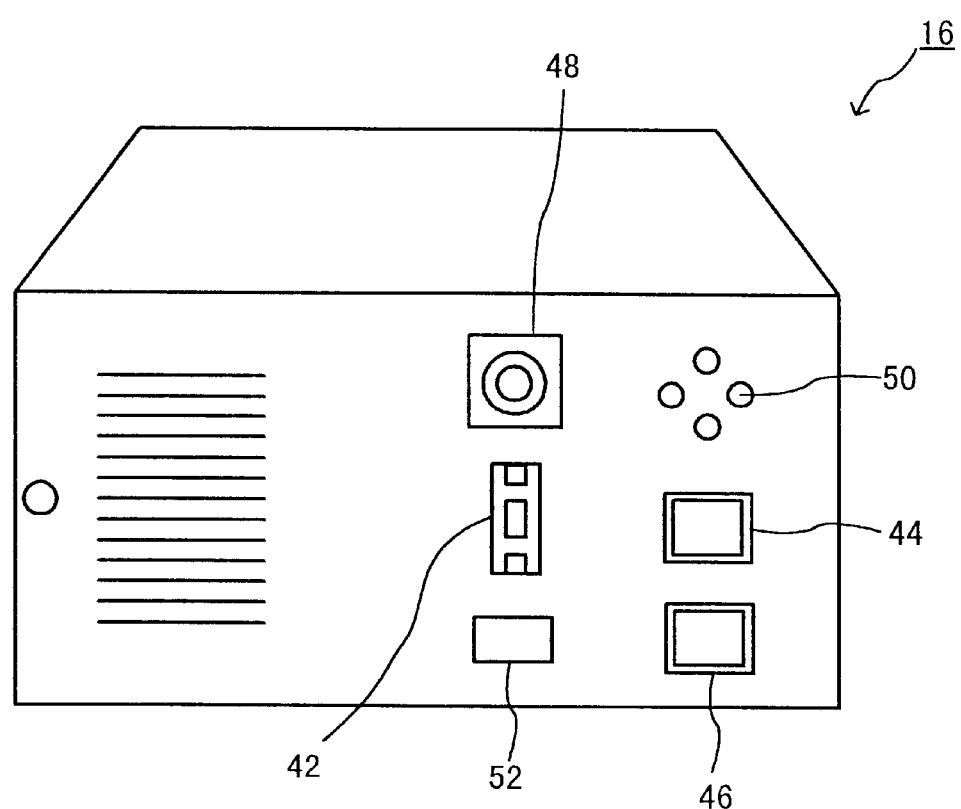
FIG. 10 is a perspective view illustrating a control unit used in the polishing apparatus of the embodiment.

FIG. 10 shows the control unit 16, which includes a package selector 42, a rotation speed controller 44, a pressure controller 46, a timer 48, an indicator 50 and a start switch 52. The package selector 42 is set to an appropriate position determined based on the type of LSI packages held on the package holder unit 10 so as to select the suitable mask 24 corresponding to the LSI packages. The rotation speed controller 44 is set to an appropriate level so as to control rotation speed of the wire brushes 12a and 12b. The pressure controller 46 is set to an appropriate level to control pressure of the wire brushes 12a and 12b applied in the vertical direction to the leads 32a (32b, 32c and 32d). The timer 48 is set to an appropriate value determined in response to polishing condition, such as the type of package.

Figure 11:
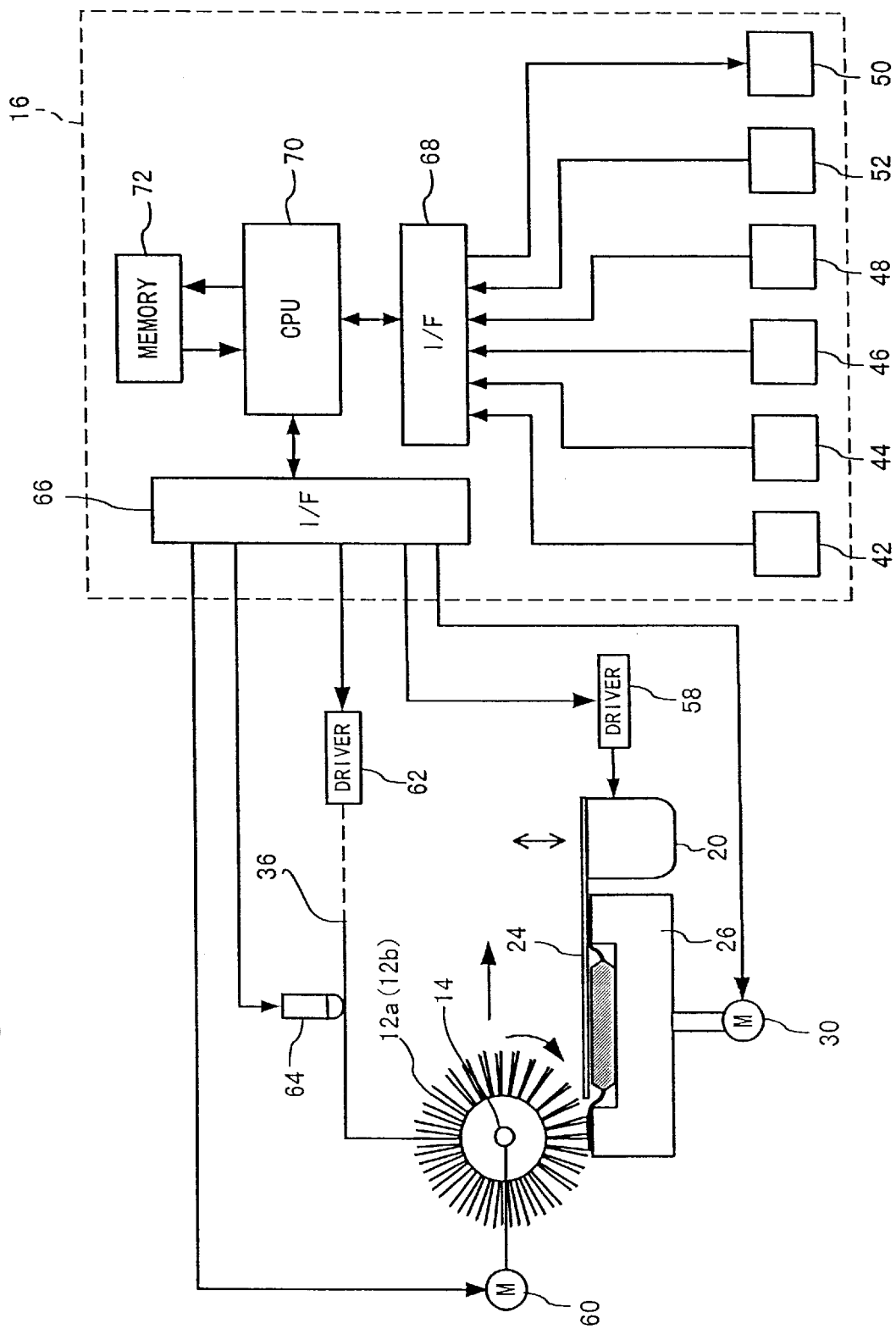
FIG. 11 is a block diagram mainly showing components of the control unit, shown in FIG. 10.

FIG. 11 shows a control system of the polishing apparatus including drive mechanism. The shaft 14 of the wire brushes 12a and 12b is connected to a motor 60. Each of the package holders 26 is connected to a motor 30 so that each package holder 26 is rotated independently. The base frame 20 is connected to a driver 58 to move in the vertical direction. The sliding bar 36 is connected to a driver 62 to move in the horizontal direction. The sliding bar 36 is in contact with a pressure sensor 64 to detect the pressure of the wire brushes 12a and 12b applied vertically to the leads 32a (32b, 32c and 32d). The motors 30 and 60, the drivers 58 and 62 and the pressure sensor 64 is connected via an interface unit 66 to a CPU 70 of the control unit 16.

The control unit 16 includes, besides the CPU 70 and the interface unit 66, an interface unit 68 and a memory 72, connected to the CPU 70. The interface unit 68 is connected to the package selector 42, the rotation speed controller 44, the pressure controller 46, the timer 48, the indicator 50 and the start switch 52. The CPU 70 controls via the interface units 66 and 68 those components 30, 42 to 52, 58, 60 and 62.

Next, the operation of the polishing apparatus is now described. First, the control units 16 controls the driver 58 to move up the base frame 20 so that the clamp plate 22 and the mask 24 are apart from the package holder 26. Then, the LSI packages 32 are arranged on the package holders 26. Next, in response to a signal from the package selector 42, the control unit 16 selects an appropriate mask 24 and calculates areas of polishing, corresponding to the slits 24a of the selected mask 24. The selected mask 24 is arranged on the package holder 26 so that the first line of lead 32a is only exposed for each LSI package 32.

The control unit 16 also determines rotation speed of the wire brushes 12a and 12b, in response to a signal from the rotation speed controller 44. Further, the control unit 16 determines polishing time in response to a signal from the timer 48, and pressure of the wire brushes 12a and 12b in response to a signal from the pressure controller 46. The rotation speed controller 44, the pressure controller 46 and the timer 48 are set to the optimum value in response to the degree of contamination.

When all the polishing conditions are set, first quarter of polishing process starts in response to the operation of the start switch 52. The first quarter of polishing process means polishing operation of the first line of leads 32a of all the LSI packages 32. And as well, second, third and final quarters of polishing process means polishing operation of the second, third and fourth lines of leads 32b, 32c and 32d, respectively.

In the first quarter of polishing process, the wire brushes 12a and 12b slides in the direction, shown by the arrows in FIG. 1, to position just above the first pair of LSI packages 32. When brushing of the first line of leads 32a of the first pair of LSI packages 32 are finished, the wire brushes 12a and 12b are moved up by the motor 60 and are slide to the next pair of LSI packages 32 by the sliding bar 36. Such operation is repeated until the last pair of LSI packages 32 are polished.

When the first quarter of polishing process is over, the clamp plate 22 and the mask 24 are moved up and the each package holder 26 rotates ninety degrees to place the second line of leads 32b at the polishing area. Next, the clamp plate 22 and the mask 24 are moved down, and then the second quarter of polishing process starts in the same manner as the first quarter. The third and final quarters of polishing process are carried out in the same manner as the first quarter of polishing. When the final quarter of polishing process is over, the polishing apparatus automatically finishes the operation.

During the polishing operation, the indicator 50 indicates the current quarter of polishing process. In this embodiment, all the four lines of leads 32a, 32b, 32c and 32b are not necessarily polished, but only one to three lines of leads may be polished.

According to the above-described embodiment, the leads 32a, 32b, 32c and 32d of the LSI packages 32 are automatically polished, so that the polishing process is carried out efficiently. The leads are polished in the optimum condition, so that the leads can be polished without any damages, such as bend and break. As a result, the leads have a good contact-reliability, and the LSI packages have good reliability as well.

What is claimed is:

1. A method for polishing leads of a semiconductor package, comprising the steps of:

arranging a plurality of semiconductor packages in a certain manner;

masking the semiconductor packages to expose at least a part of the leads to be polished;

automatically polishing the leads of the semiconductor packages, and further comprising the step of:
rotating the semiconductor packages so that leads extending in different directions are alternately exposed for polishing.

2. The method, according to claim 1, wherein the leads are polished by brushing with a rotary brush, and further comprising the step of controlling at least one of the following parameters:

(1) rotation speed of the rotary brush;

(2) pressure of the rotary brush, vertically applied to the leads; and (3) time of the brushing.

3. A method for polishing leads of a semiconductor package having a first side from which a plurality of first leads extend in a first extending direction and a second side from which a plurality of second leads extend in a second extending direction, the second extending direction being different from the first extending direction, the method comprising the steps of:

arranging a plurality of said semiconductor packages in a manner so that a mask may be positioned to cover and protect one of the plurality of first leads or the plurality of second leads of the respective semiconductor packages;

masking the plurality of semiconductor packages with a masking means to expose at least a part of the leads extending from the respective package bodies in one of the first extending direction or the second extending direction; and automatically polishing the leads of the plurality of semiconductor packages which are exposed with a polishing member along the direction of extension of the leads so that the plurality of leads are not bent; and further comprising the step of:

rotating the plurality of semiconductor packages so that the masking means covers the plurality of semiconductor packages while sequentially exposing the plurality of leads of another of the plurality of sides for polishing.

4. A method for polishing leads of a semiconductor package having a first side from which a plurality of first leads extend in a first extending direction and a second side from which a plurality of second leads extend in a second extending direction, the second extending direction being different from the first extending direction, the method comprising the steps of:

arranging a plurality of said semiconductor packages in a manner so that a mask may be positioned to cover and protect one of the plurality of first leads or the plurality of second leads of the respective semiconductor packages;

masking the plurality of semiconductor packages with a masking means to expose at least a part of the leads extending from the respective package bodies in one of the first extending direction or the second extending direction; and automatically polishing the leads of the plurality of semiconductor packages which are exposed with a polishing member along the direction of extension of the leads so that the plurality of leads are not bent;

wherein automatically polishing is achieved by brushing the portions of the leads which are exposed with a rotary brush as the polishing member and further comprising the step of:

controlling at least one parameter selected from the group consisting essentially of:
(1) rotation speed of the rotary brush;
(2) pressure of the rotary brush, vertically applied to the leads; and
(3) time of the brushing.

5. A method for polishing leads of a semiconductor package having a first side from which a plurality of first leads extend in a first extending direction and a second side from which a plurality of second leads extend in a second extending direction, the second extending direction being different from the first extending direction, the method comprising the steps of:

arranging a plurality of said semiconductor packages in a manner so that a mask may be positioned to cover and protect one of the plurality of first leads or the plurality of second leads of the respective semiconductor packages;

masking the plurality of semiconductor packages with a masking means to expose at least a part of the leads extending from the respective package bodies in one of the first extending direction or the second extending direction; and automatically polishing the leads of the plurality of semiconductor packages which are exposed with a polishing member along the direction of extension of the leads so that the plurality of leads are not bent, wherein each of the plurality of package holders is provided with a cavity in which one semiconductor package of the plurality of semiconductor packages is arranged so that the respective plurality of first leads thereof are arranged on an upper surface of respective ones of the plurality of package holders; and further comprising the step of:

holding each one of the plurality of semiconductor packages independently with a respective one of a plurality of package holders prior to automatically polishing the leads prior to automatically polishing.

6. A method for polishing leads of a semiconductor package having a first side from which a plurality of first leads extend in a first extending direction and a second side from which a plurality of second leads extend in a second extending direction, the second extending direction being different from the first extending direction, the method comprising the steps of:

arranging a plurality of said semiconductor packages in a manner so that a mask may be positioned to cover and protect one of the plurality of first leads or the plurality of second leads of the respective semiconductor packages;

masking the plurality of semiconductor packages with a masking means to expose at least a part of the leads extending from the respective package bodies in one of the first extending direction or the second extending direction; and automatically polishing the leads of the plurality of semiconductor packages which are exposed with a polishing member along the direction of extension of the leads so that the plurality of leads are not bent; and further comprising the step of:

holding each one of the plurality of semiconductor packages independently with a respective one of a plurality of package holders prior to automatically polishing the leads prior to automatically polishing; and further comprising the step of:

rotating the plurality of package holders so that the masking means covers each semiconductor package of the plurality of semiconductor packages while sequentially exposing the plurality of leads of another of the plurality of sides for polishing.

7. The method according to claim 6, wherein automatically polishing includes horizontally sliding the polishing member with a slider means so that the polishing member polishes the plurality of first leads or the plurality of second leads Of the respective semiconductor packages one after another.

* * * * *